(12) United States Patent
Heinrichs

(10) Patent No.: US 6,901,094 B2
(45) Date of Patent: May 31, 2005

(54) OPERATING POINT DETERMINATION FOR MODE-SELECTION LASER

(75) Inventor: Yves Heinrichs, Stuttgart (DE)

(73) Assignee: Agilent Technologies, Inc., Palo Alto, CA (US)

( * ) Notice: Subject to any disclaimer, the term of this patent is extended or adjusted under 35 U.S.C. 154(b) by 66 days.

(21) Appl. No.: 10/449,945

(22) Filed: May 30, 2003

(65) Prior Publication Data

US 2004/0109479 A1 Jun. 10, 2004

(30) Foreign Application Priority Data

Dec. 6, 2002 (EP) .............................................. 02102701

(51) Int. Cl.$^7$ .................................................. H01S 3/00
(52) U.S. Cl. ........................... 372/38.1; 372/20; 372/92; 372/102
(58) Field of Search ............................ 372/20, 38.1, 92, 372/102

(56) References Cited

U.S. PATENT DOCUMENTS

| | | | | | |
|---|---|---|---|---|---|
| 5,319,668 | A | * | 6/1994 | Luecke | 372/107 |
| 5,548,609 | A | * | 8/1996 | Kitamura | 372/92 |
| 5,867,512 | A | * | 2/1999 | Sacher | 372/20 |
| 6,763,044 | B2 | * | 7/2004 | Mueller et al. | 372/20 |
| 6,795,454 | B2 | * | 9/2004 | Nebendahl | 370/20 |
| 6,807,217 | B2 | * | 10/2004 | Mueller | 372/102 |

FOREIGN PATENT DOCUMENTS

| | | |
|---|---|---|
| DE | 196 45 029 | 5/1998 |
| EP | 0 687 045 | 12/1995 |
| EP | 0 849 846 | 6/1998 |
| EP | 0 938 171 | 8/1999 |
| EP | 1 182 752 | 2/2002 |
| EP | 1 202 408 | 5/2002 |
| EP | 1 202 409 | 5/2002 |
| EP | 1 231 684 | 8/2002 |
| WO | WO 98/05105 | 2/1998 |

OTHER PUBLICATIONS

Sauerer, C., Examiner. European Search Report, Application No. EP 02 10 2701, dated Mar. 19, 2003.
Wandt D. et al. "Continuously Tunable External–Cavity Diode Laser with a Double–Grating Arrangement," Optics Letters, Wshington, vol. 22, No. 16, Mar. 15, 1997, pp. 390–392, XP000690335.
Favre, F. et al. "82 NM of Continuous Tunability for an External Cavity Semiconductor Laser," Electronics Letters, vol. 27, No. 2, Jan. 17, 1991, pp. 183–184, XP000201222.

* cited by examiner

Primary Examiner—Minsun Oh Harvey
Assistant Examiner—Delma R. Flores-Ruiz

(57) ABSTRACT

A laser unit has a laser mode selection and provides a laser signal in accordance to a laser control parameter. A plurality of pairs of values is determined for the laser control parameter and a laser operation parameter indicative of the laser unit's operation to provide the laser signal. A target operating point for the laser unit is derived from the determined pairs of values in conjunction with a model and a selection criterion for selecting the target operating point, wherein the model represents an assumed relationship between the laser control parameter and the laser operation parameter. A curve for the relationship between the laser control parameter and the laser operation parameter is approximated based on the determined pairs of values in conjunction with the model, the curve limited on at least one side having a defined boundary in a range where mode hopping is likely, and the target operating point selected on the approximated curve based on the selection criterion.

18 Claims, 2 Drawing Sheets

OPERATING POINT DETERMINATION FOR MODE-SELECTION LASER

BACKGROUND OF THE INVENTION

1. Field of the Invention

The present invention relates to laser sources having mode selection.

2. Discussion of the Background Art

In the optical communication industry there is a need for testing e.g. optical components and amplifiers with laser signals. For this purpose, various types of laser cavities are known.

Tunable lasers are described e.g. as the so-called Littman geometry in "Liu and Littman, Novel geometry for single-mode scanning of tunable lasers, Optical Society of America, 1981", or as the so-called Littrow geometry in EP-A-952643 or U.S. Pat. No. 5,802,085. Bragg-reflector type cavities are shown e.g. in "A. Nahata et al., Widely Tunable Semiconductor Laser Using Dynamic Holographically-Defined Distributed Bragg Reflector, 2000 IEEE".

The Littman cavity allows tuning wavelength and optical length of the cavity at the same time by changing only one parameter of the geometry, i.e. the tuning element. However, as already pointed out by Liu and Littman in the aforementioned document, mode hops might occur due to deviations of the real geometry with respect to the perfect Littman configuration. Fine adjustment e.g. of the laser end mirror is proposed to avoid mod hops. Examples of lasers, based on the Littman or other geometries, and various options for reducing or avoiding mode hops can be found e.g. in the co-pending European Patent applications 01121408.7, 01113372.5, or 01113371.7 of the same applicant, or in the pending International Patent application PCT/EP02/04736 also by the same applicant.

SUMMARY OF THE INVENTION

According to the present invention, an analysis unit is provided adapted for providing an operating point adjustment for an optical source comprising a laser unit and a control unit. The laser unit having a laser mode selection provides a laser signal representing an output of the optical source. The laser unit is preferably tunable in wavelength. The laser unit is coupled to the analysis unit. An output of the analysis unit is provided to the control unit, which controls setting of one or more laser control parameters of the laser unit for generating the laser signal.

The laser unit preferably comprises a single-mode laser and/or an external cavity arrangement, wherein mode selection is provided. Such external cavity arrangement might comprise one of the aforementioned Littman, Litrow, or Bragg-reflector type configurations. The teaching of all aforementioned documents with respect to such laser configurations shall be incorporated herein by reference. However, any other laser configuration providing laser mode selection is applicable accordingly.

In operation when the optical source is to provide the laser signal, the laser unit generates the laser signal according to its predefined laser control parameter(s). The analysis unit receives at least one laser operation signal each relating to a laser operation parameter indicative of the laser unit's operation. The laser operation parameter can be, for example, total power of the optical output, ratio of intracavity and output power, the wavelength of the optical output, the power of spontaneous source emission, the power of the side-modes of the laser, the amplitude, phase or frequency noise of the optical output, a drive parameter for a laser gain medium (e.g. to maintain constant optical output power) such as electrical current, voltage or power for driving the laser gain medium (e.g. a laser diode).

When the laser unit is enabled (e.g. switched on) for operation to provide the laser signal, one mode of a plurality (typically three) of possible laser modes (defined e.g. by the actual geometry of the laser unit) will become dominant as result of the mode selection. However, it usually cannot be predicted which one of the possible modes will become dominant, since the process of mode selection can be the result of statistic processes but also subject to deterministic properties, such as actual laser geometry, temperature, etc., which—in practice—are usually difficult or almost impossible to determine precisely.

In order to adjust the present operating point (defined by at least one laser control parameter) of the laser unit, the analysis unit first determines a plurality of pairs of values for a first laser control parameter and a first laser operation parameter. The minimum required number of pairs of values depends on a model assumed for the behavior of the first laser operation parameter over the first laser control parameter used for the operation point adjustment.

In one embodiment, the analysis unit determines the first pair of values at the present operating point by deriving values of the first laser control parameter and the first laser operation parameter at the present operating point. The analysis unit then instructs the control unit to modify the first laser control parameter, and determines a value of the first laser operation parameter corresponding to the modified first laser control parameter, thus deriving a second pair of values for the first laser control parameter and the first laser operation parameter. Dependent on the model, the analysis unit might then instruct the control unit to further modify the first laser control laser parameter to derive further pairs of values for the first laser control parameter and the first laser operation parameter. It goes without saying that the first pair of values can also be derived at any other point different from the present operating point.

In case a mode hop, i.e. a different mode becomes dominant and thus the selected mode, occurs (e.g. caused by the modification of the first laser control parameter), the aforedescribed process of determining the appropriate number of pairs of values is preferably repeated since the behavior of this new mode might deviate from the former mode. However, the occurrence of one or more mode hops together with knowledge about the laser unit (e.g. geometry of a laser cavity) can also be used to conclude back on the actual behavior of the laser unit and thus on the presently selected mode.

In a preferred embodiment, the modification of the first laser control parameter is controlled in order to avoid or reduce the likelihood of the occurrence of a mode hop during the process of determining the pairs of values. Preferably, a priori knowledge might be used, for example knowledge about the distance between modes, the range of a curve of the first laser operation parameter over the first laser control parameter for each mode, etc. Using such a priori knowledge, the analysis unit can limit the variation of the first laser control parameter for determining the pairs of values.

In one embodiment, the analysis unit instructs the control unit to either only increase or only decrease the first laser control parameter during the course of obtaining the pairs of values. Thus e.g. ambiguities from changed directions can be avoided.

After having determined the appropriate number of pairs of values for the first laser control parameter and the first laser operation parameter, the analysis unit can then approximate a curve of the first laser operation parameter over the first laser control parameter, or vice versa, based on the determined pairs of values in conjunction with the assumed model. Such approximation can be accomplished, for example, using any kind of fitting algorithm as well known in the art for fitting an appropriate curve (in accordance with the assumed model) to the determined pairs of values.

In a preferred embodiment, the model takes into consideration that a variation of the first laser control parameter beyond a certain range of the curve can lead to a mode hop. The curve is therefore limited on one or both sides having defined boundaries in ranges where mode hops become likely. In other words, the range of values of the first laser control parameter is limited on one or both sides, with the boundaries being selected in ranges where mode hops become likely.

In this context it is to be understood (as also outlined above) that an actual curve of the first laser operation parameter over the first laser control parameter (or vice versa), if directly measured, is usually not unbounded but will show jumps or at least transitions to curves of neighboring modes as result of mode hopping. Whether jumps or (more or less smooth) transitions to curves of neighboring modes actually occur depends on various factors and might be subject to the specific mode of operation. In a preferred embodiment, this is encountered by selecting one or both boundaries of the curve in a range outside such ranges where mode hops become likely, and preferably just before or substantially adjacent to such ranges where mode hops become likely. This is in particular of advantage, since such transitions between mode curves, e.g. under the influence of the so-called mode pulling effect, can be difficult to incorporate into the model and thus into the curve approximation.

In one embodiment, one or more mode hops are actively 'provoked' in order to gain knowledge about the position of such mode hops thus allowing defining one or more boundaries for the approximated curve.

In one embodiment, at least one characteristic point (e.g. a minimum or maximum) of the curve is determined using the aforedescribed process. Then, a mode hope is provoked, e.g. by varying the first laser control parameter in one direction until a mode hop occurs. The difference between the values of the first laser control parameter at the characteristic point and at the position where the mode hop occurred thus allows to define a first boundary in a first operating range between the values of the first laser control parameter at the characteristic point and at the position where the mode hop occurred.

A second boundary can then be derived e.g. by provoking a mode hop when varying the first laser control parameter in the other direction (opposite as for determining the first boundary) until a mode hop occurs. The difference between the values of the first laser control parameter at the characteristic point and at the position where the mode hop occurred thus allows to define the second boundary in a second operating range between the values of the first laser control parameter at the characteristic point and at the position where the mode hop occurred.

Instead of directly determining, the second boundary can also be derived from the first boundary and assuming a certain operating range of the first laser control parameter thus leading to the second boundary. The assumed operating range can be derived e.g. from previous run(s) as the range between mode hops. It goes without saying that certain safety margins can applied to limit the operating range in order to safely avoid mode hops when varying the first laser control parameter within the operating range. After having derived the approximated curve, the analysis unit can determine a target operating point representing an appropriate operating point on the curve for operating the laser unit.

In one embodiment, the target operating point is selected to achieve sufficient security against the occurrence of mode hops.

Using such model with discrete boundaries to the left and right, the target operating point is preferably selected substantially in the middle between such boundaries. This allows having sufficient margin for operating the laser unit thus rendering the laser unit less susceptible to varying operating conditions, e.g. varying ambient or operating temperatures, mechanical shock, etc.

In another embodiment, the target operating point is preferably selected in a range of a local minimum or maximum of the curve (and preferably at the local minimum or maximum), as long as such selected target operating point keeps sufficient distance from the boundaries. Threshold values for the distance from the boundaries might be applied for the selection.

Instead of first approximating a curve and then selecting the target operating point on the curve, the target operating point can also be directly derived from the determined pairs of values in conjunction with the underlying model and the selection criterion/criteria used for selecting the target operating point. In this case, there is no requirement for explicitly approximating or fitting the curve. Any appropriate mathematical algorithm can be used for the purpose.

The analysis unit can adjust the operating point of the laser unit by instructing the control unit to set the value of the first laser control parameter in the target operating point to the laser unit. The laser unit is then ready for regular operation in the adjusted operating point. This procedure of determining an appropriate operating point thus allows operating the laser unit dependent on its actual properties and characteristics, which might be hardly predictable as, described above.

In one embodiment, the analysis unit—after having adjusted the operating point of the laser unit to the first laser control parameter in the target operating point—determines an actual value of the first laser operation parameter corresponding to the modified first laser control parameter, thus deriving a actual pair of values at the target operating point. The analysis unit might use this actual pair of values for correcting the determined curve, for example if the deviation of the actual value of the first laser operation parameter from the value of the curve exceeds a given value. Alternatively or in addition, the analysis unit might adjust the model (e.g. using a polynomial function of higher or lower order) and/or determine additional pairs of values in order to achieve a better approximation of the curve.

In one preferred embodiment, the first laser control parameter is selected to be a drive parameter for driving a laser gain medium of the laser unit. Such drive parameter might be one of: electrical current, voltage, or power. The laser gain medium is preferably controlled by the control unit in order to provide a substantially constant optical output power of the laser signal. The model for the curve is preferably selected to be of second (quadratic behavior) or higher order. In case of quadratic model, three pairs of values will be sufficient to approximate the curve. In case the curve is substantially symmetric within its boundaries, the appropriate operating point is preferably selected in the minimum or maximum of the approximated curve. However, in case of an asymmetric curve in the boundaries, the minimum/maximum might be too close to the boundaries, so that the appropriate operating point is preferably selected to be substantially in the middle between the two boundaries.

In another embodiment, the laser gain medium is operated with substantially constant drive parameter(s), e.g. substantially constant laser current or laser power. In this case preferably the optical output power or similar optical parameter is applied for the first laser operation parameter. The model for the curve is preferably selected to be of second (quadratic behavior) or higher order. The aforesaid with respect to the embodiment above applies accordingly.

In one embodiment wherein the laser unit is tunable in wavelength, the selected target operating point is used to adjust an adjustment curve for the first laser control parameter with respect to its behavior over wavelength. Such adjustment curve might be used, for example, to adjust the first laser control parameter during a sweep in wavelength in order to avoid mode hops occurring during that sweep, e.g. as disclosed in the aforementioned International Patent Application PCT/EP02/04736, which teaching with respect to such adjustment curves shall be incorporated herein by reference. The analysis unit preferably determines an offset between the values for the first laser control parameter of the target operating point and the value in the adjustment curve corresponding to the same wavelength. This offset is then used for adjusting the adjustment curve, e.g. by applying the offset to the entire adjustment curve.

In case that plural target operating points have been determined for different wavelengths, the adjustment curve can be adjusted using more than one of such determined target operating points, e.g. by applying a fitting algorithm for fitting the adjustment curve to the determined target operating points. Alternatively or in addition, the adjustment curve can also be adjusted in shape to the determined target operating points, e.g. using known curve adjustment algorithms.

In a further embodiment wherein the laser unit is tunable in wavelength, the aforedescribed scheme for determining an appropriate operating point can be repeated several times at different wavelengths. Using a λ-model for the behavior of the first laser control parameter over the wavelength, the curve is then approximated using the determined target operating points for different wavelengths, preferably using fitting techniques as well known in the art.

The adjustment curve is preferably modified to meet the value of the first laser control parameter of the target operating point at the corresponding value of wavelength for one or more of the determined target operating points.

While the scheme for deriving the target operating point (s) has been described in the foregoing with respect to an initial setup, e.g. after the laser unit has been switched on, it is clear that the inventive scheme can be applied at any other point in time (e.g. during operation of the laser unit) in order to adjust the operating point. For example, the inventive scheme might be applied before operation of the laser unit, only occasionally, according to a predefined schedule, during specific calibration runs, etc.

The inventive scheme might be initiated by a user of the laser source and/or automatically run following predefined adjustment intervals and/or after certain events (e.g. mode hops) occur. The operating point adjustment according to the present invention might also be disabled, e.g. by user, for example in order to avoid changes in the measuring condition during measurements with multiple sequential wavelength sweeps.

In a preferred embodiment, the laser unit comprises coarse and fine tuning elements. The coarse tuning elements already allow continuously tuning the laser signal, whereby mode hops might occur from deviations between actual and theoretically defined conditions, from tolerances, aging of components, etc. Such coarse tuning elements can be, for example, the aforementioned Liftman, Litrow, or any other tunable laser configuration in principle. The fine tuning elements allow correction or modification of the laser arrangement in order to reduce or avoid mode hops. Preferred examples for fine-tuning elements are disclosed in the documents mentioned in the introductory part of the description.

The fine tuning elements are preferably applied for providing the operation point adjustment according to one or more of the aforedescribed embodiments of the present invention.

The fine-tuning element can be provided e.g. for modifying a filter curve for selecting modes. Such variation in the filter curve can be achieved e.g. by one or more of the following: moving a dispersion element for selecting at least one laser mode (e.g. as disclosed in the aforementioned European Patent application 01113371.7), modifying the dispersive characteristic of a dispersive element e.g. by modifying the periodicity of the dispersive element, modifying the direction of the beam incident to the dispersive element, by moving a retro-reflective dispersive element, etc.

Additionally or alternatively, the fine-tuning element might comprise elements for modifying the optical path length in the external cavity. This can be provided e.g. by moving one of the cavity elements to change the geometrical length (for example by moving at least one of the end mirrors), moving an optical element such as a wedge substantially perpendicular to the optical beam, controlling the optical path length of at least one of the cavity elements by an external parameter (such as applied electrical or magnetic field, temperature, uni-axial or hydrostatic pressure), controlling the orientation of the optical active axis by an external parameter.

In a preferred embodiment, the analysis unit comprises a wavemeter, preferably as disclosed in EP-A-875743 by the same applicant. Using such wavemeter also allows, in case that one or more mode hops occurred, determining how many such mode hops occurred. The difference in wavelength together with the difference in wavelength between modes (e.g. known from the geometry) allows determining the number of mode hops.

The wavemeter allows measuring the wavelength of the laser signal (e.g. at a specific wavelength or during the wavelength sweep) and allows determining the course/ variation of the wavelength λ or the wavelength variation (Δλ or Δλ/λ) of the provided laser signals (e.g. over time or over a motor position for tuning the coarse tuning element). The analysis unit can analyze the measured course/variation preferably for discontinuities, jumps or strong variations (e.g. over given limits) in order to have indications for mode hops.

In a further preferred embodiment, laser activity can be repeatedly disabled (e.g. by switching the laser on and off or reducing the laser power slightly below lasing threshold) in order to avoid mode pulling. Mode pulling represents the effects that one mode remains lasing although a different mode would be selected (e.g. by a filter curve).

The invention can be partly embodied or supported by one or more suitable software programs, which can be stored on or otherwise provided by any kind of data carrier, and which might be executed in or by any suitable data processing unit. Software programs or routines are preferably applied for analyzing the laser operation signal, determining the necessary change of the laser control parameters and providing the control parameters e.g. during a wavelength sweep.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF PREFERRED EMBODIMENTS OF THE INVENTION

Figure 1:
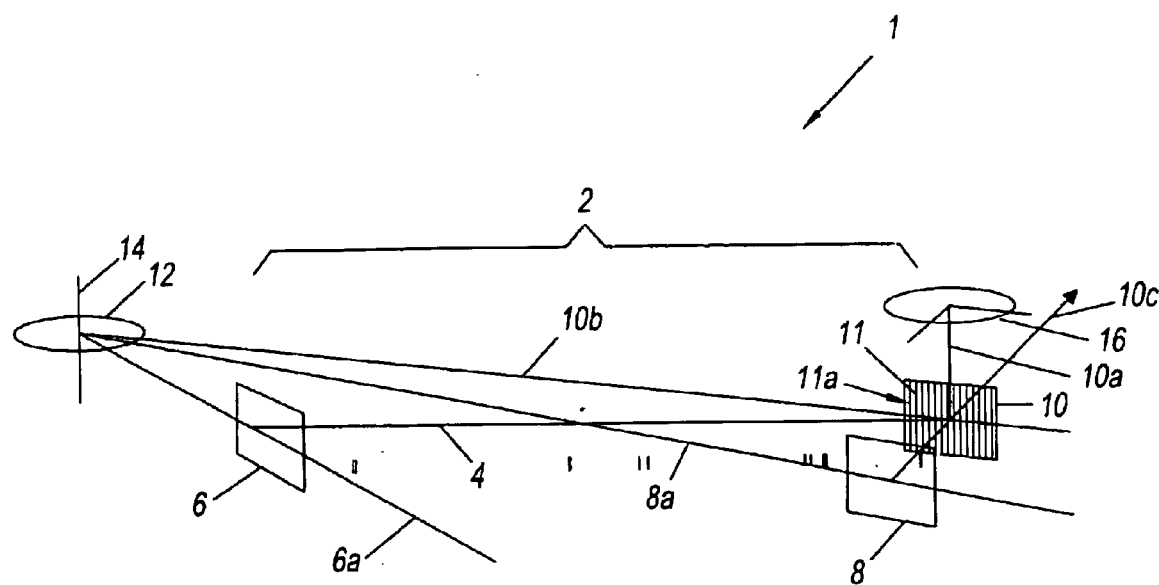
FIG. 1 shows a schematic view of an embodiment of a lasing module 1 for generating a laser signal.

In FIG. 1, a lasing module 1 comprises an external cavity 2 in which laser light provided by an active medium (not shown), e.g. a laser diode, can resonate to provide a laser beam 4. The beam 4 travels in the cavity 2 along a path between a cavity end element 6 and a tuning element 8 of the external cavity 2. The cavity end element 6 and the tuning element 8 both provide a high reflective mirror. The lasing module 1 further comprises a dispersion element 10 introduced in the path of the beam 4 for selecting at least one longitudinal mode of the laser. The dispersion element comprises a grating 11 having rules 11a.

The tuning element 8 can be rotated by an actuator (not shown) according to arrow 12 about a pivot axis 14 to tune the laser. The pivot axis 14 is theoretically defined by the intersection of the surface plane (indicated by line 6a) of the cavity end element 6, the surface plane (indicated by line 10b) of the dispersion element 10 and the surface plane (indicated by line 8a) of the tuning element 8.

The dispersion element 10 can be moved corresponding (preferably simultaneously) with the rotation of the tuning element 8 to compensate a shift between the real position of the pivot axis 14 and the theoretically defined position. This can be done by moving the dispersion element 10 along such a predetermined path that the compensation is sufficient to provide continuous single-mode tuning within a predetermined tuning range of the tuning element 8. The dispersion element 10 can be moved by rotating as indicated as arrow 16 by a predetermined rotation angle about the rotating axis 10a, which is substantially parallel to the rules 11a and substantially lies in the plane of the grating 11.

Compensating shift between the real position of the pivot axis 14 and the theoretically defined position can be achieved—in addition or alternatively—e.g. by moving the grating 11 linearly along an axis 10c which is perpendicular to the grating 11 and lies in the plane of the axis 10b and 8a, or other adequate measures.

Figure 2:
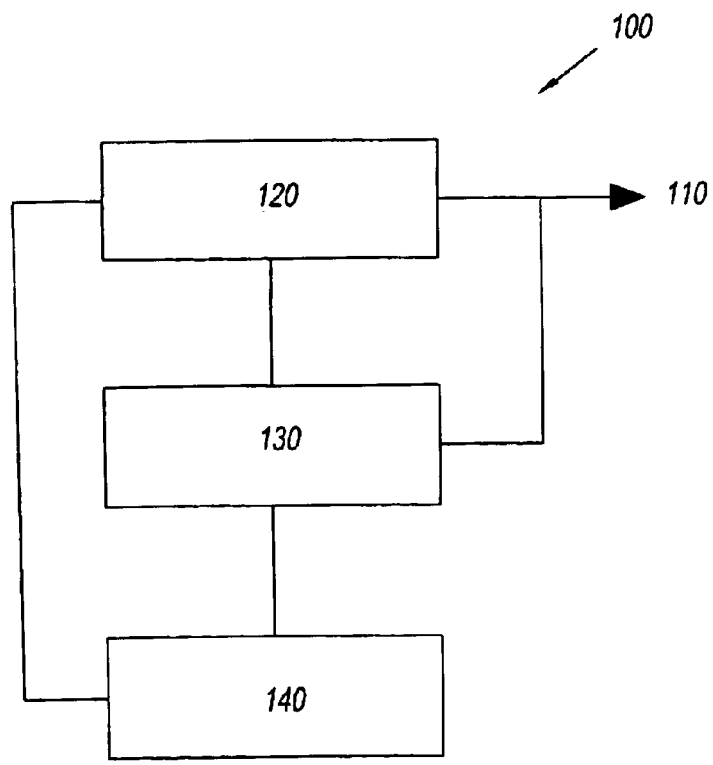
FIG. 2 shows a principle embodiment of an optical source 100 according to the present invention.

In FIG. 2, the optical source 100 comprises a laser unit 120, an analysis unit 130, and a control unit 140. The laser unit 120 preferably comprises the lasing module 1 for generating a laser signal 110 representing an output of the optical source 100. However, any other tunable lasing device might be applied accordingly. The laser unit 120 is further coupled to the analysis unit to receive a laser operation signal indicative of the laser unit's operation, which can be e.g. the laser signal 110 or another operation parameter. An output of the analysis unit 130 is provided to the control unit 140, which controls setting of at least one laser control parameter of the laser unit 120 for generating the laser signal 110.

Figure 3:
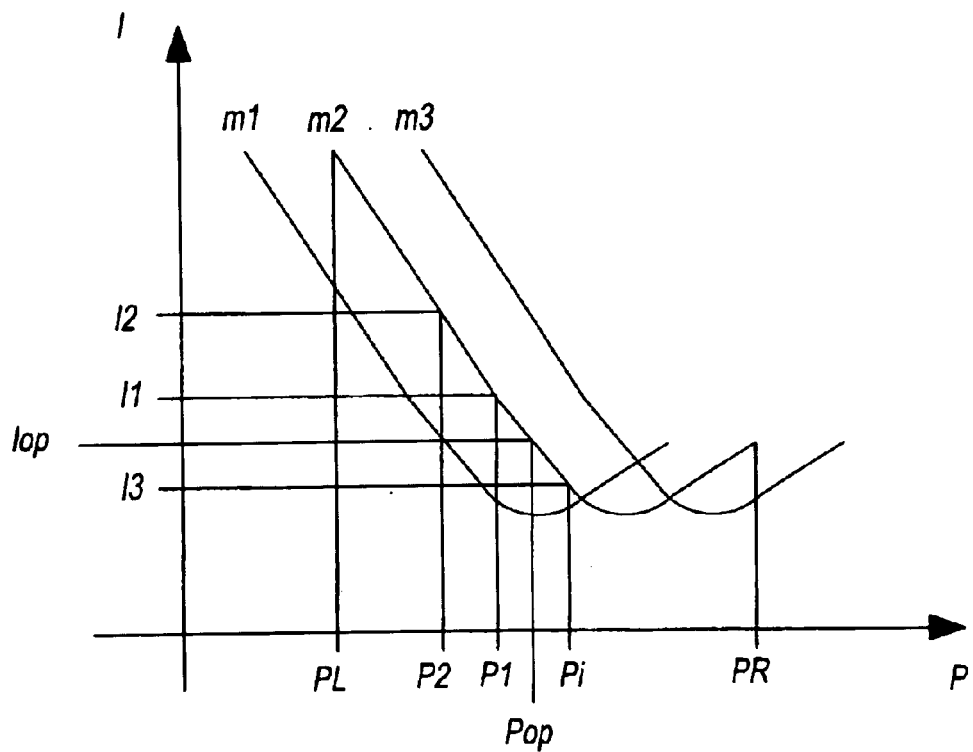
FIGS. 3–4 illustrate examples operating point adjustments according to preferred embodiments of the present invention.

When the laser unit 120 is enabled (e.g. switched on), one of several laser modes becomes dominant. In the example of FIG. 3, the x-axis shows the position P of a coarse-tuning element rotating the tuning element 8 according to error 12 about the axis 14 to tune the laser, and the y-axis denotes a laser current for driving a laser diode in the lasing module 1. After switching on the laser diode, one of the modes (in FIG. 3: potential modes $m_1$, $m_2$, and $m_3$) will become dominant (in FIG. 3: mode $m_2$ shall be dominant), and a laser current $I_i$ results corresponding to the initial position $P_i$. In this example, the optical output power is controlled by the control unit 140 to be substantially constant.

The curve for each mode in FIG. 3 can be assumed to be substantially quadratic within its boundaries. For the sake of simplicity, the mode curves have been shown in FIG. 3 with discrete boundaries, in case of mode $m_2$ with the left boundary at position $P_L$ and the right boundary at position $P_R$. When exceeding those boundaries, an occurrence of a mode hop becomes very likely, e.g. when exceeding the position $P_L$ of curve $m_2$ further to the left, mode $m_1$ is likely to become dominant.

Since the actual course of the curve for the selected mode is not clear from the initial pair of values $(P_i, I_i)$ at the initial position, the analysis unit 130 instructs the control unit to modify the position to a new position $P_1$, and determines the correspondingly resulting current $I_1$. The procedure is repeated for a new position $P_2$, and a corresponding current $I_2$ is determined. With these three pairs of values for the positions $P_i$, $P_1$, $P_2$ (as indicated as circles in FIG. 3), the analysis unit 130 fits a quadratic curve of second order to the three pairs of values, thus deriving an approximation for the curve $m_2$.

The boundaries $P_L$ and $P_R$ can be assigned to the approximated curve e.g. using prior knowledge about the expected range of the curve. In one embodiment, the right boundary $P_R$ is assigned by first deriving the minimum of the fitted curve m. The boundary $P_R$ is then assigned to the right position in a given distance from the derived minimum using knowledge (e.g. from previous runs wherein mode hops occurred) that mode hops become significantly likely with positions beyond the given distance from the minimum of the curve. The left boundary $P_L$ is then derived by subtracting a range of applicable positions (also preferably derived from previous runs) from the right boundary $P_R$.

After having approximated the curve $m_2$, the analysis unit 130 determines an appropriate operating point $P_{OP}$. In the example of FIG. 3 with an asymmetric shape of curve $m_2$, the operating point $P_{OP}$ is selected to be substantially in the middle between the boundaries $P_R$ and $P_L$. However, in case of a symmetric shape within the boundaries, the operating point $P_{OP}$ is preferably selected to the local minimum/maximum.

The analysis unit 130 then instructs the control unit 140 to set the position P to the operating point $P_{OP}$, and the laser unit is ready for operation.

Figure 4:
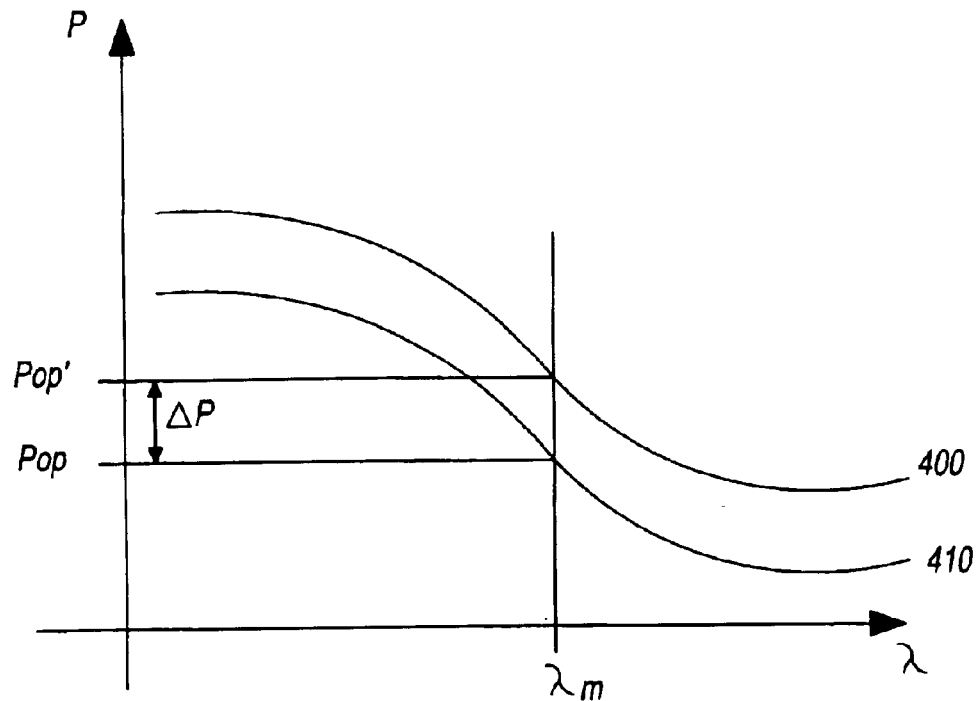

FIG. 4 shows an adjustment curve for the position P in order to maintain the same selected mode as dominant mode when tuning over the wavelength λ. The upper curve 400, in this example, shall have been determined by providing a stepped sweep over a specified wavelength range and determining the target operating point at each wavelength step (for the same lasing mode). After having thus determined a plurality of target operating points for different wavelengths, preferably a polynomial function is fitted to the data points in order to achieve the adjustment curve 400.

Since the curve 400 relates to a specific laser mode that might not be the selected mode in a successive run, the curve 400 is preferably be adapted to the actual behavior of the laser unit 120. For this purpose, the aforedescribed procedure (as shown with respect to FIG. 3) can be executed for determining at a wavelength $\lambda_m$ the target operating point $P_{OP}$ for the actually selected laser mode. Curve 400 is then modified to a curve 410 crossing the position $P_{OP}$ at the wavelength $\lambda_m$. This can be achieved, for example, by determining an offset ΔP between a position $P_{OP}'$ on of curve 400 and the determined operating point position $P_{OP}$, each at $\lambda_m$. This offset ΔP is preferably applied throughout the entire range of wavelength, if it can be assumed that the principle course for each mode is maintained.

In another preferred embodiment, the laser current I is maintained substantially constant instead of maintaining the optical power substantially constant as shown in the example of FIG. 3. The resulting curve e.g. of the optical power over the position P substantially corresponds to FIG. 3, however, with the difference that the curve is substantially mirrored horizontally, so that a minimum in FIG. 3 would result in a maximum. The aforedescribed procedure for determining the operating point $P_{OP}$ and/or the adjustment curve of FIG. 4 can be executed accordingly.

What is claimed is:

1. A method for deriving a target operating point for a laser unit having a laser mode selection and being adapted to provide a laser signal in accordance to a laser control parameter, the method comprising the steps of:

(a) determining a plurality of pairs of values for the laser control parameter and a laser operation parameter indicative of the laser unit's operation to provide the laser signal, and (b) deriving the target operating point from the determined pairs of values in conjunction with a model and a selection criterion for selecting the target operating point, wherein the model represents an assumed relationship between the laser control parameter and the laser operation parameter, wherein the step b comprises the steps of:

approximating a curve for the relationship between the laser control parameter and the laser operation parameter based on the determined pairs of values in conjunction with the model, limiting the curve on at least one side having a defined boundary in a range where mode hopping is likely, and selecting the target operating point on the approximated curve based on the selection criterion.

2. The method of claim 1, wherein the step of approximating the curve comprises the step of:

fitting an appropriate curve based on the model to the determined pairs of values.

3. The method of claim 1, wherein the step a comprises the steps of:

(a1) modifying the laser control parameter, (a2) determining a value of the laser operation parameter corresponding to the modified laser control parameter, and (a3) repeating the steps a1 of modifying and a2 of determining until the plurality of pairs of values has been determined.

4. The method of claim 1, wherein the step a comprises the steps of:

(a0) determining a value of the laser operation parameter corresponding to the present laser control parameter, (a1) modifying the laser control parameter, (a2) determining a value of the laser operation parameter corresponding to the modified laser control parameter, and (a3) repeating the steps a1 of modifying and a2 of determining until the plurality of pairs of values has been determined.

5. The method of claim 1, comprising at least one of the following steps after a mode hop occurred in the provision of the laser signal:

repeating steps a and b, deriving the target operating point from the determined pairs of values in conjunction with knowledge about potential laser modes of the laser unit.

6. The method of claim 1, further comprising the steps of:

deriving a characteristic point on the curve relating to the presently selected mode, modifying the laser control parameter in a first direction until a mode hop occurs, determining a first operating range as a range between the values of the first laser control parameter at the characteristic point and before the mode hop occurred, selecting a first boundary to be within the first operating range and having a first distance in the first direction from the characteristic point, and executing the step of limiting the curve on one side by deriving, if not yet derived, the characteristic point of the curve relating to the presently selected mode and assigning the first boundary in the first distance from derived characteristic point.

7. The method of claim 6, further comprising the steps of:

deriving, if not yet derived, the characteristic point on the curve relating to the presently selected mode, modifying the laser control parameter in a second direction until a mode hop occurs, determining a second operating range as a range between the values of the first laser control parameter at the characteristic point and before the mode hop occurred, selecting a second boundary to be within the second operating range and having a second distance in the second direction from the characteristic point, and executing the step of limiting the curve on the other side by deriving, if not yet derived, the characteristic point of the curve relating to the presently selected mode and assigning the second boundary in the second distance from derived characteristic point.

8. The method of claim 6, further comprising the step of:

executing the step of limiting the curve on the other side by assigning a second boundary in a second distance from the first boundary.

9. The method of claim 1, further comprising the steps of:
modifying the laser control parameter until a mode hop occurs,
using the knowledge about the occurred mode hop for at least one of:
determining a limit for the curve, where mode hopping becomes likely beyond the limit,
revising the model,
revising the selection criterion.

10. The method of claim 1, further comprising the step of:
modifying at least one the wavelength of the laser signal,
determining a respective target operating point for each modified wavelength.

11. The method of claim 1, further comprising the step of:
using the determined target operating point for adjusting an adjustment curve, wherein the adjustment curve is applicable for adjusting the first laser control parameter with respect to a variation in wavelength; or
in case that plural target points have been determined by modifying at least one of the wavelength of the laser signal and determining a respective target operating point for each modified wavelength,
a using one or more of the determined target operating points for adjusting the adjustment curve.

12. The method of claim 11, further comprising the steps of:
determining an offset between the values for the first laser control parameter at the target operating point and at the adjustment curve corresponding to substantially the same wavelength,
using the offset for adjusting the adjustment curve.

13. The method of claim 10, further comprising the step of:
using a λ-model for the assumed behavior of the first laser control parameter over the wavelength,
approximating an adjustment curve by using a plurality of the determined target operating points for different wavelengths, wherein the adjustment curve is applicable for adjusting the first laser control parameter with respect to a variation in wavelength.

14. A method for operating a laser unit having a laser mode selection and being adapted to provide a laser signal in accordance to a laser control parameter, the method comprising the steps of:
(a) deriving a target operating point for a laser unit having a laser mode selection and being adapted to provide a laser signal in accordance to a laser control parameter, the method comprising the steps of: (a) determining a plurality of pairs of values for the laser control parameter and a laser operation parameter indicative of the laser unit's operation to provide the laser signal, and (b) deriving the target operating point from the determined pairs of values in conjunction with a model and a selection criterion for selecting the target operating point, wherein the model represents an assumed relationship between the laser control parameter and the laser operation parameter, wherein the step b comprises the steps of: (i) approximating a curve for the relationship between the laser control parameter and the laser operation parameter based on the determined pairs of values in conjunction with the model, (ii) limiting the curve on at least one side having a defined boundary in a range where mode hopping is likely, and (iii) selecting the target operating point on the approximated curve based on the selection criterion, and
(b) setting the laser control parameter of the laser unit to be the value of the laser control parameter in the target operating point.

15. The method of claim 14, further comprising the steps of:
varying the laser unit in wavelength, and
using an adjustment curve for adjusting the first laser control parameter with respect to the variation in wavelength.

16. A software program or product, optionally stored on a data carrier, for executing a method for deriving a target operating point for a laser unit having a laser mode selection and being adapted to provide a laser signal in accordance to a laser control parameter, the method comprising the steps of: (a) determining a plurality of pairs of values for the laser control parameter and a laser operation parameter indicative of the laser unit's operation to provide the laser signal, and (b) deriving the target operating point from the determined pairs of values in conjunction with a model and a selection criterion for selecting the target operating point, wherein the model represents an assumed relationship between the laser control parameter and the laser operation parameter, wherein the step b comprises the steps of: (i) approximating a curve for the relationship between the laser control parameter and the laser operation parameter based on the determined pairs of values in conjunction with the model, (ii) limiting the curve on at least one side having a defined boundary in a range where mode hopping is likely, and (iii) selecting the target operating point on the approximated curve based on the selection criterion, when run on a data processing system such as a computer.

17. An analysis unit adapted for deriving a target operating point for a laser unit having a laser mode selection and being adapted to provide a laser signal in accordance to a laser control parameter, the analysis unit comprising:
a values determining unit adapted for determining a plurality of pairs of values for the laser control parameter and a laser operation parameter indicative of the laser unit's operation to provide the laser signal, and
a target operating point deriving unit adapted for deriving the target operating point from the determined pairs of values in conjunction with a model and a selection criterion for selecting the target operating point, wherein the model represents an assumed relationship between the laser control parameter and the laser operation parameter,
wherein the target operating point deriving unit is further adapted for:
approximating a curve for the relationship between the laser control parameter and the laser operation parameter based on the determined pairs of values in conjunction with the model,
limiting the curve on at least one side having a defined boundary in a range where mode hopping is likely, and
selecting the target operating point on the approximated curve based on the selection criterion.

18. An optical source comprising:
a laser unit having a laser mode selection and being adapted to provide a laser signal in accordance to a laser control parameter,
a control unit adapted for controlling operation of the laser unit by providing the laser control parameter to the laser unit, and an analysis unit adapted for deriving a target operating point for a laser unit having a laser mode selection and being adapted to provide a laser signal in accordance to a laser control parameter, the analysis unit comprising:
- a values determining unit adapted for determining a plurality of pairs of values for the laser control parameter and a laser operation parameter indicative of the laser unit's operation to provide the laser signal, and
- a target operating point deriving unit adapted for deriving the target operating point from the determined pairs of values in conjunction with a model and a selection criterion for selecting the target operating point, wherein the model represents an assumed relationship between the laser control parameter and the laser operation parameter, wherein the target operating point deriving unit is further adapted for:
- approximating a curve for the relationship between the laser control parameter and the laser operation parameter based on the determined pairs of values in conjunction with the model,
- limiting the curve on at least one side having a defined boundary in a range where mode hopping is likely, and selecting the target operating point on the approximated curve based on the selection criterion, said analysis unit adapted for deriving a target operating point for the laser unit.

* * * * *